(12) United States Patent
Goh

(10) Patent No.: US 10,418,982 B2
(45) Date of Patent: *Sep. 17, 2019

(54) FOLDED DIVIDER ARCHITECTURE

(71) Applicant: STMicroelectronics Asia Pacific Pte Ltd, Singapore (SG)

(72) Inventor: Beng-Heng Goh, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/113,235

(22) Filed: Aug. 27, 2018

(65) Prior Publication Data

US 2018/0367129 A1 Dec. 20, 2018

Related U.S. Application Data

(62) Division of application No. 15/811,223, filed on Nov. 13, 2017, now Pat. No. 10,079,593, which is a division of application No. 15/167,216, filed on May 27, 2016, now Pat. No. 9,847,778.

(51) Int. Cl.
| | |
|---|---|
| *H03K 5/15* | (2006.01) |
| *H03L 7/197* | (2006.01) |
| *H03L 7/183* | (2006.01) |
| *H03K 23/50* | (2006.01) |
| *H03L 7/16* | (2006.01) |

(52) U.S. Cl.
CPC ....... *H03K 5/15033* (2013.01); *H03K 23/502* (2013.01); *H03L 7/16* (2013.01); *H03L 7/183* (2013.01); *H03L 7/1974* (2013.01)

(58) Field of Classification Search
CPC ........ H03K 23/00; H03K 23/64; H03K 23/66; H03K 23/662; H03K 23/665; H03K 23/667; H03K 23/68; H03K 23/70; H03K 23/72
USPC ................................. 327/114–117, 119, 120
See application file for complete search history.

(56) References Cited

U.S. PATENT DOCUMENTS

| | | | |
|---|---|---|---|
| 6,072,348 A | 6/2000 | New et al. | |
| 7,365,661 B2 | 4/2008 | Thomas | |

*Primary Examiner* — Lincoln D Donovan
*Assistant Examiner* — Diana J. Cheng
(74) *Attorney, Agent, or Firm* — Crowe & Dunlevy

(57) ABSTRACT

A method includes loading a clock divider counter with most significant bits (MSBs) of a divider value, decrementing the counter at a same edge of each pulse of a clock signal, and comparing a value contained in the counter to a reference value and generating an end count signal if the value contained in the counter matches the reference value. If the value is even, the reference value is set to 1. If the value is odd, the reference value is set to 1, except for every other assertion of the end count signal, where the reference value is instead set to 0. A toggle signal transitions at a same edge of each pulse of the end count signal. The counter is reloaded with MSBs of the divider value based upon the end count signal. A divided version of the clock signal is generated based upon the toggle signal.

46 Claims, 13 Drawing Sheets

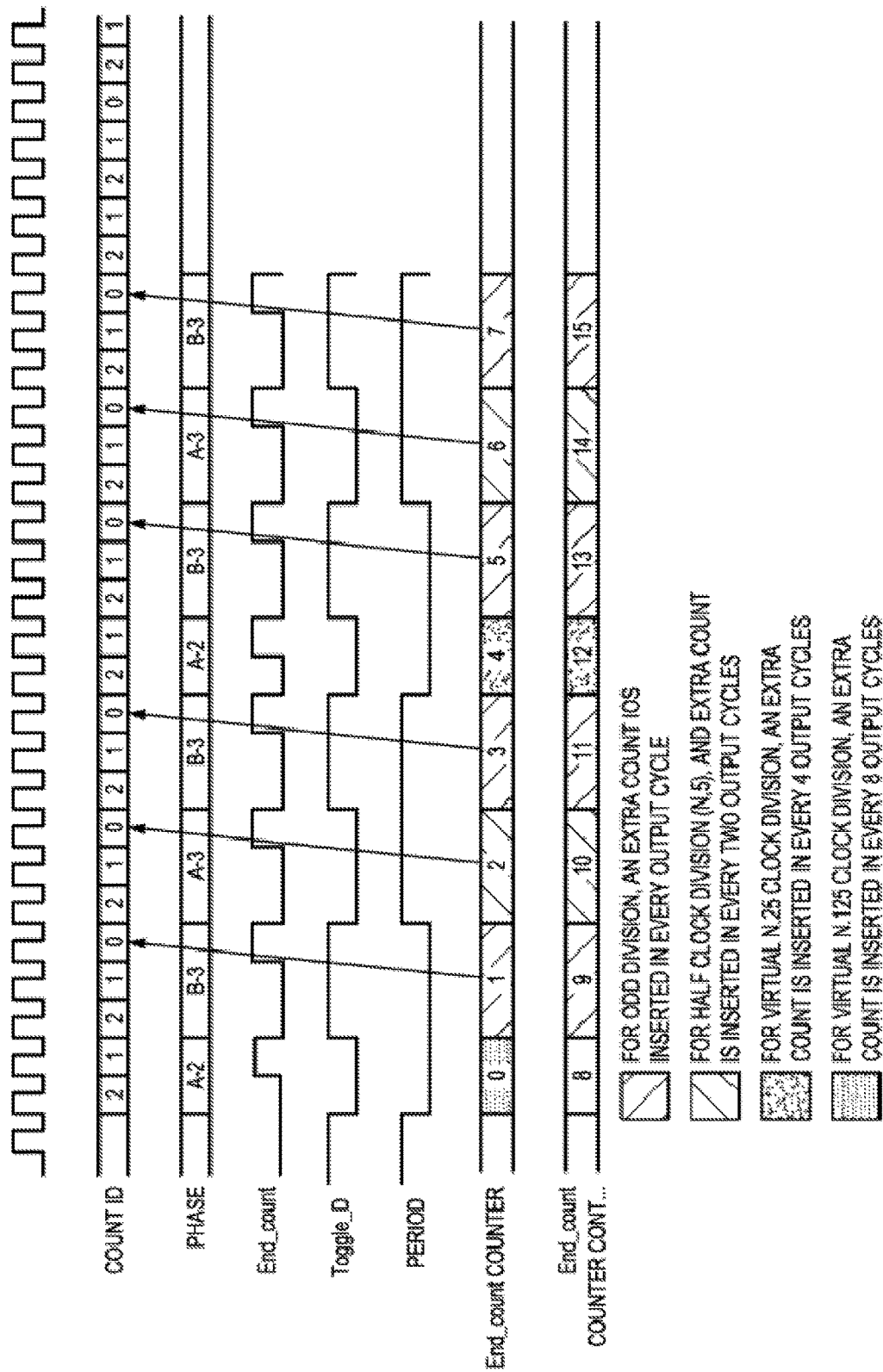

FOLDED DIVIDER ARCHITECTURE

CROSS REFERENCE TO RELATED APPLICATIONS

This application is a divisional of U.S. patent application Ser. No. 15/811,223 filed Nov. 13, 2017, which is a divisional of United States application for patent Ser. No. 15/167,216 filed May 27, 2016 (now U.S. Pat. No. 9,847,778), the disclosures of which are incorporated by reference.

TECHNICAL FIELD

This disclosure is related to the field of clock signal generation and, more particularly, to the generation of multiple clock signals of different frequency and/or duty cycle from an input clock signal.

BACKGROUND

In the field of electronic devices, such as systems on a chip, a phase lock loop is often used to generate a master clock signal. That master clock signal is then divided downward into a variety of different clock signals for use by different components within the system on chip.

This division is performed by coupling multiple divider circuits to the output of the phase locked loop. For example, a divide by 2, a divide by 4, and a divide by 8 divider circuit are each coupled to the phase locked loop. However, this approach has drawbacks. For example, power consumption may be undesirably high.

It is therefore desirable for new divider circuits to be developed.

SUMMARY

One aspect is directed to a method including loading a clock divider counter with most significant bits of a divider value, decrementing the clock divider counter at a same edge of each pulse of a clock signal, and comparing a value contained in the clock divider counter to a reference value and generate an end count signal as a function of the value contained in the clock divider counter matching the reference value. Where the divider value is even, the reference value is set to 1. Where the divider value is odd, the reference value is set to 1, except for every other assertion of the end count signal where the divider value is set to 0. A toggle signal is transitioned at a same edge of each pulse of the end count signal. The clock divider counter is reloaded with most significant bits of the divider value as a function of the end count signal. A divided version of the clock signal is generated as a function of the toggle signal.

The divider value may be a mixed number having an integer part and a fractional part, with the fractional part being ½. Here, where the integer part of the divider value is even, the reference value is set to 1, except for every 4th assertion of the end count signal, where the divider value is set to 0. Where the integer part of the divider value is odd, the reference value is set to 1, except for every other assertion of the end count signal, where the divider value is set to 0, and every 4th assertion of the end count signal, where the divider value is set to 0.

The divider value may be a mixed number having an integer part and a fractional part, with the fractional part being ¼. Where the integer part of the divider value is even, the reference value is set to 1, except for every 4th assertion of the end count signal, where the divider value is set to 0, and every 8th assertion of the end count signal, where the divider value is set to 0. Where the integer part of the divider value is odd, the reference value is set to 1, except for every other assertion of the end count signal, where the divider value is set to 0, every 4th assertion of the end count signal, where the divider value is set to 0, and every 8th assertion of the end count signal, where the divider value is set to 0.

The divider value may be a mixed number having an integer part and a fractional part, with the fractional part being ⅛. Where the integer part of the divider value is even, the reference value is set to 1, except for every 4th assertion of the end count signal, where the divider value is set to 0, every 8th assertion of the end count signal, where the divider value is set to 0, and every 16th assertion of the end count signal, where the divider value is set to 0. Where the integer part of the divider value is odd, the reference value is set to 1, except for every other assertion of the end count signal, where the divider value is set to 0, every 4th assertion of the end count signal, where the divider value is set to 0, every 8th assertion of the end count signal, where the divider value is set to 0, and every 16th assertion of the end count signal, where the divider value is set to 0.

BRIEF DESCRIPTION OF THE DRAWINGS

FIG. 13 is a timing showing operation of a divider while operating in accordance with the method in the flowchart of FIG. 12.

DETAILED DESCRIPTION

In the following detailed description and the attached drawings and appendices, numerous specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 1:
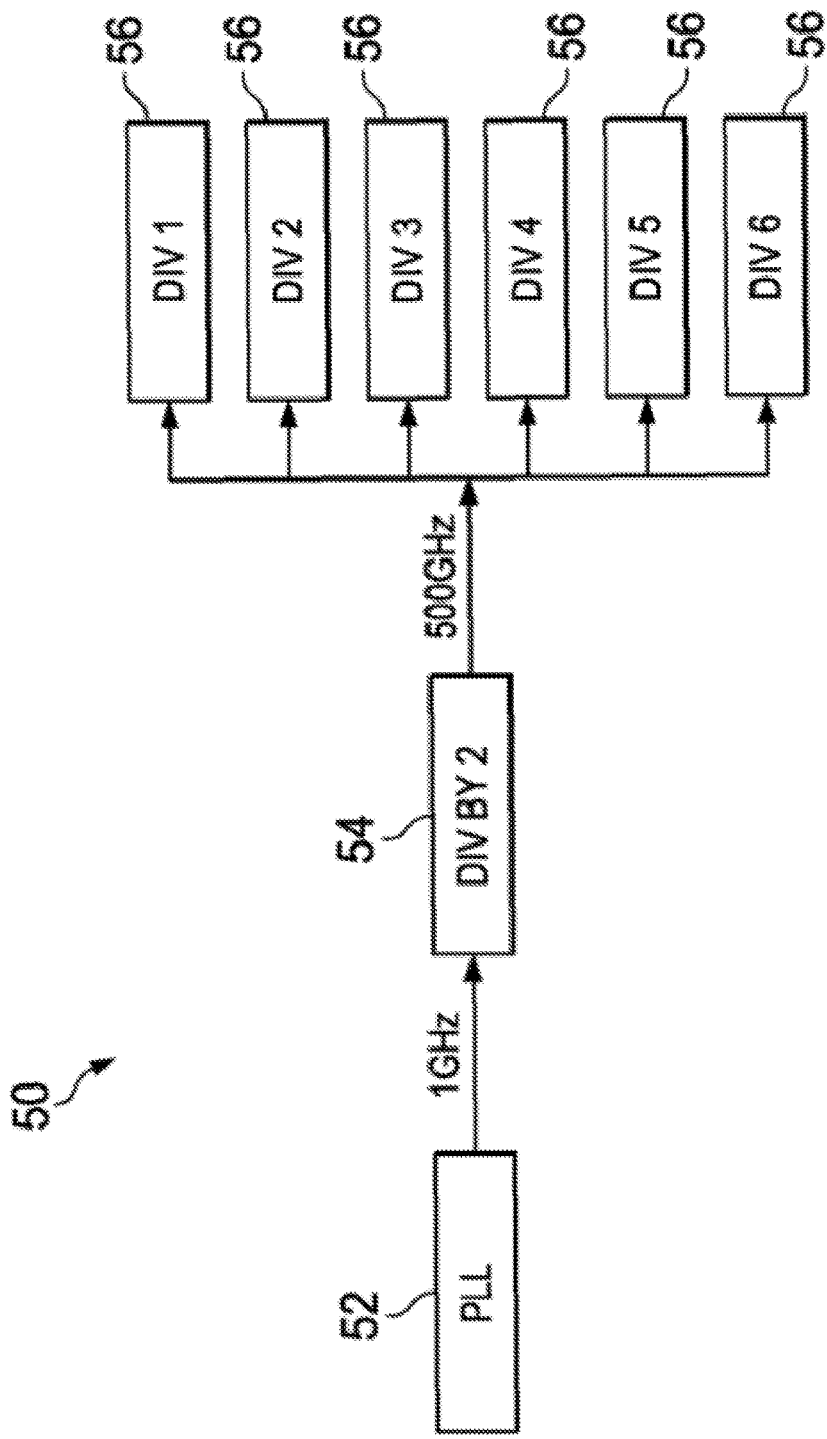
FIG. 1 is a block diagram of an electronic device in accordance with this disclosure.

With initial reference to FIG. 1, an electronic device 50 is now described. Here, the electronic device 50 may be a portion of a system on a chip (SOC), for example, which may be incorporated into a portable device, such as a smartphone, tablet, or smartwatch.

The electronic device 50 includes a phase locked loop 52 that outputs a first clock signal, such as a 1 GHz clock signal. A divider block 54 divides the first clock signal by two, and thus outputs a second clock signal such as a 500 MHz clock signal to each of the divider blocks 56 (DIV1 to DIVE). The divider blocks 56 divide the second clock signal and will now be described with further reference to FIGS. 2-3. It should be appreciated that there may be any number of divider blocks 56 (such as ten or more), that each divider block 56 may divide by a different amount, and that some divider blocks 56 may divide by integer numbers while other divider blocks may divide by fractional numbers.

Each divider block 56 includes a counter circuit 100 that includes a divider counter store 102 that is configured to store a number (Divider_value) by which that divider block 56 is to divide second clock signal, and a clock divider counter 104. The clock divider counter 104 is loaded with the most significant bits of the number in the divider counter store 102 when enabled by output from the OR gate 106.

An AND gate 108 receives as input the least significant bit of the divider counter store 102 and a toggle signal, and provides an output that is then inverted and fed to an input of a NOR gate 110, and fed to an input of a NOR gate 112 in uninverted form. Each bit held in the clock divider counter 104 is fed to other inputs of the NOR gate 110, as well as the NOR gate 112, with the least significant bit being inverted prior to being fed to the input of the NOR gate 112. Outputs from the NOR gates 110 and 112 are fed as inputs to the OR gate 114, which assert an end count signal (End_count), which is fed as input to the OR gate 106 together with a load signal.

Figure 4:
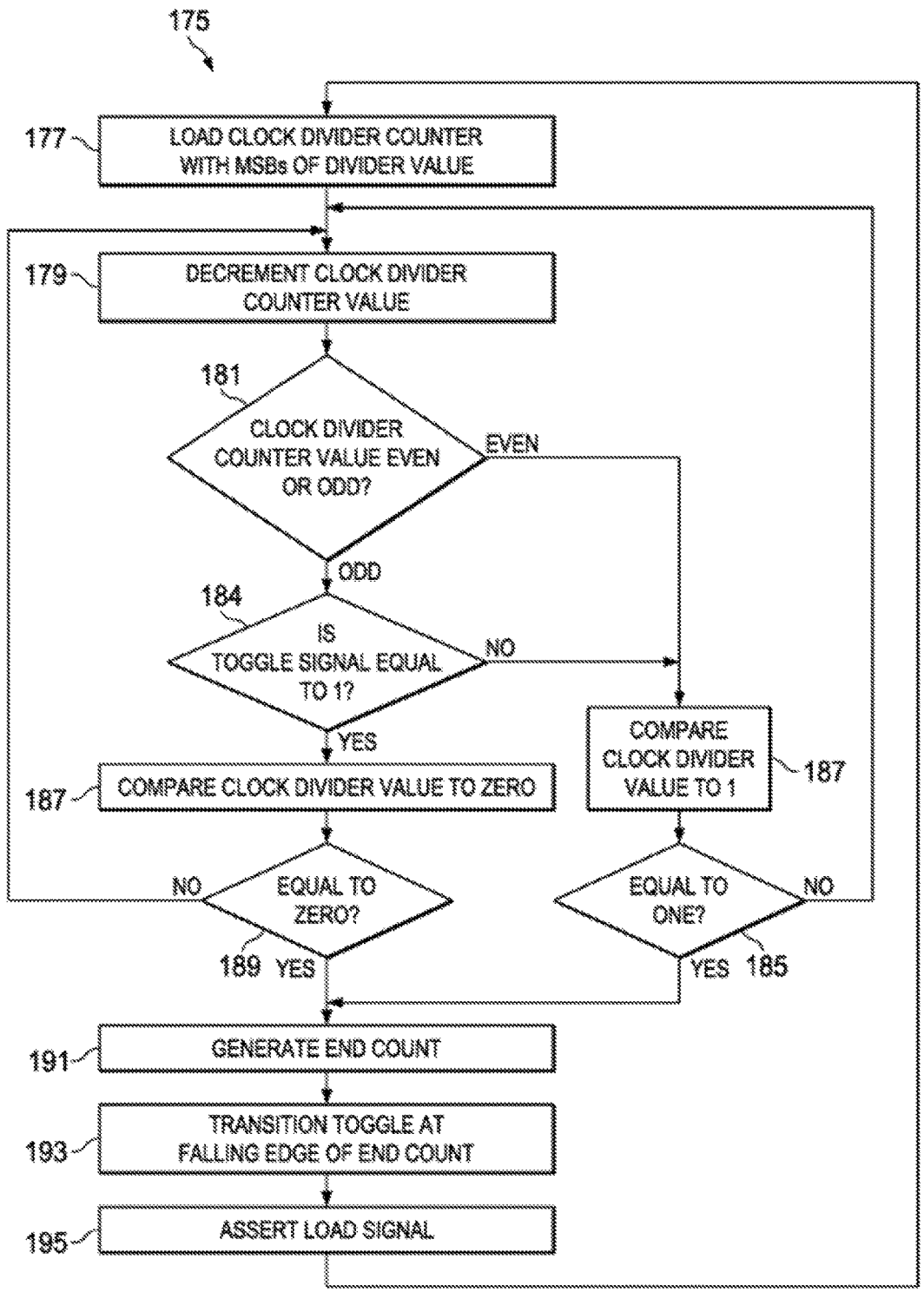
FIG. 4 is a flowchart of a method of operation of the counter circuit of FIG. 2.

Operation of the counter circuit 100 will now be described with additional reference to the flowchart 175 of FIG. 4 and timing diagrams of FIGS. 5-6. Initially, the clock divider counter 104 is loaded with the most significant bits (MSBs) of the divider value from the divider counter store 102 (Block 177) in response to the load signal. At the rising edge of each clock cycle, the clock divider counter 104 decrements the number stored therein by one (Block 179).

When the least significant bit (LSB) Bit0 of the divider value is equal to zero (Odd), the divider value is an even number (Block 181), and the NOR gate 112 serves to compare the current value contained in the clock divider counter 104 to a value of one (Block 183), and asserts its output if the current value contained in the clock divider counter 104 is equal to one (Block 185). This results in the OR gate 114 asserting its output and thus the assertion of the end count signal as high (Block 191). Where the current value contained in the clock divider counter 104 is not one, the clock divider counter value is decremented again (Block 179) in response to the clock signal, and the method restarts from there.

Where the LSB of the divider value is equal to one, the divider value is an odd number (Block 181) and where the toggle signal is equal to one (Block 184), the NOR gate 110 serves to compare the current value contained in the clock divider counter 104 to a value of zero (Block 187), and asserts its output if the current value contained in the clock divider counter 104 is equal to the value of zero (Block 189). This results in the OR gate 114 asserting its output and thus the assertion of the end count signal as high (Block 191). Where the current value contained in the clock divider counter 104 is not zero, the clock divider counter value is decremented again (Block 179) in response to the clock signal, and the method restarts from there.

After generation of the end count signal (Block 191), the toggle signal is transitioned at the falling edge of the end count signal (Block 193), which occurs when load is asserted because the clock divider counter 104 returns to the divider value number. It is noted that the load signal is asserted at the same falling edge of the end count signal (Block 195). The assertion of the load signal causes the reloading of the clock divider counter with the MSBs of the divider value (Block 177), and the method restarts from there.

Figure 2:
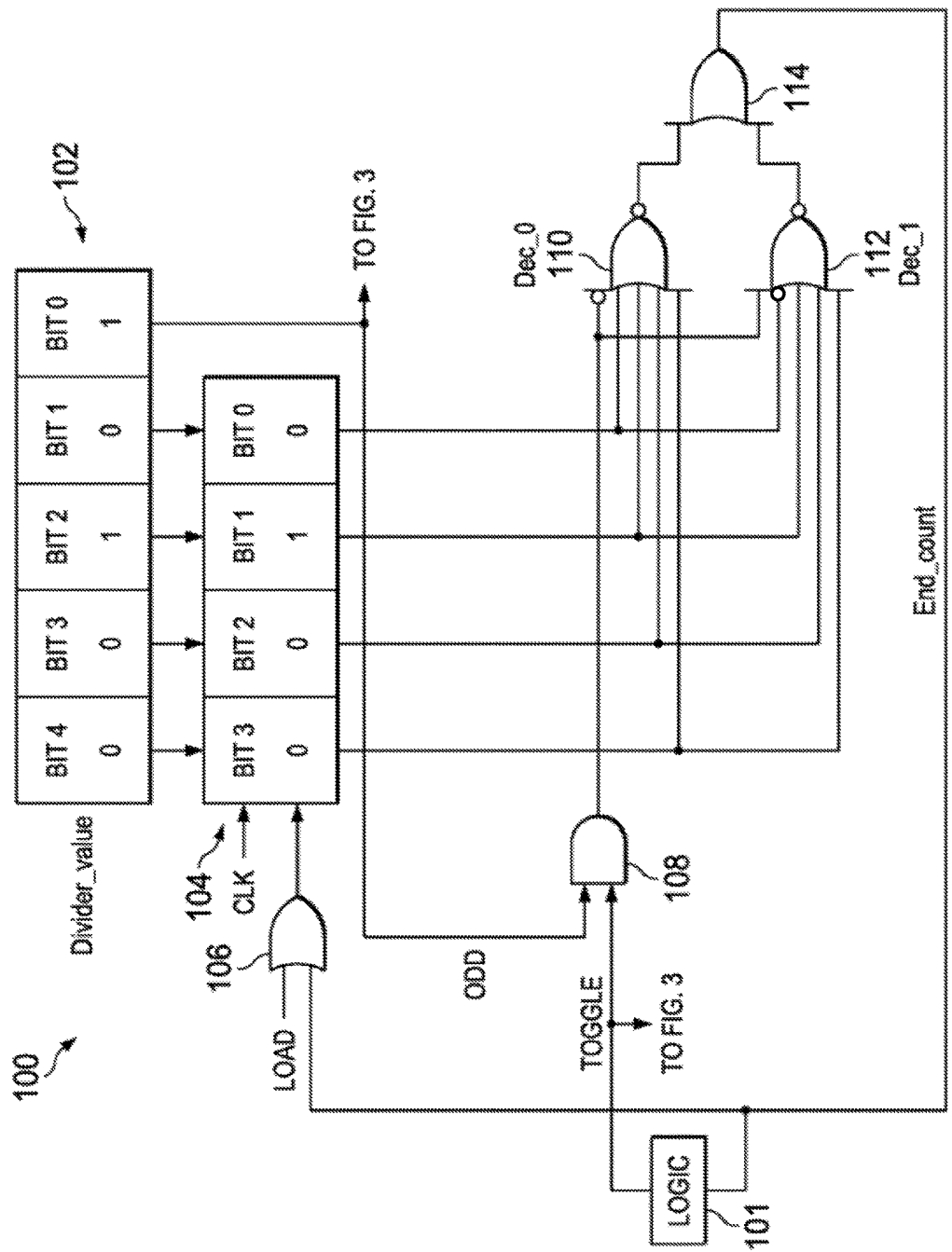
FIG. 2 is a schematic block diagram of the counter circuit of the divider blocks of FIG. 1 for the case where division by an integer is desired.
Figure 2A:
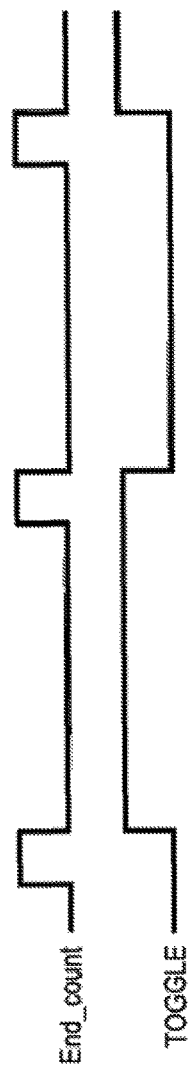
FIG. 2A is a timing diagram showing generation of the toggle signal.
Figure 5:
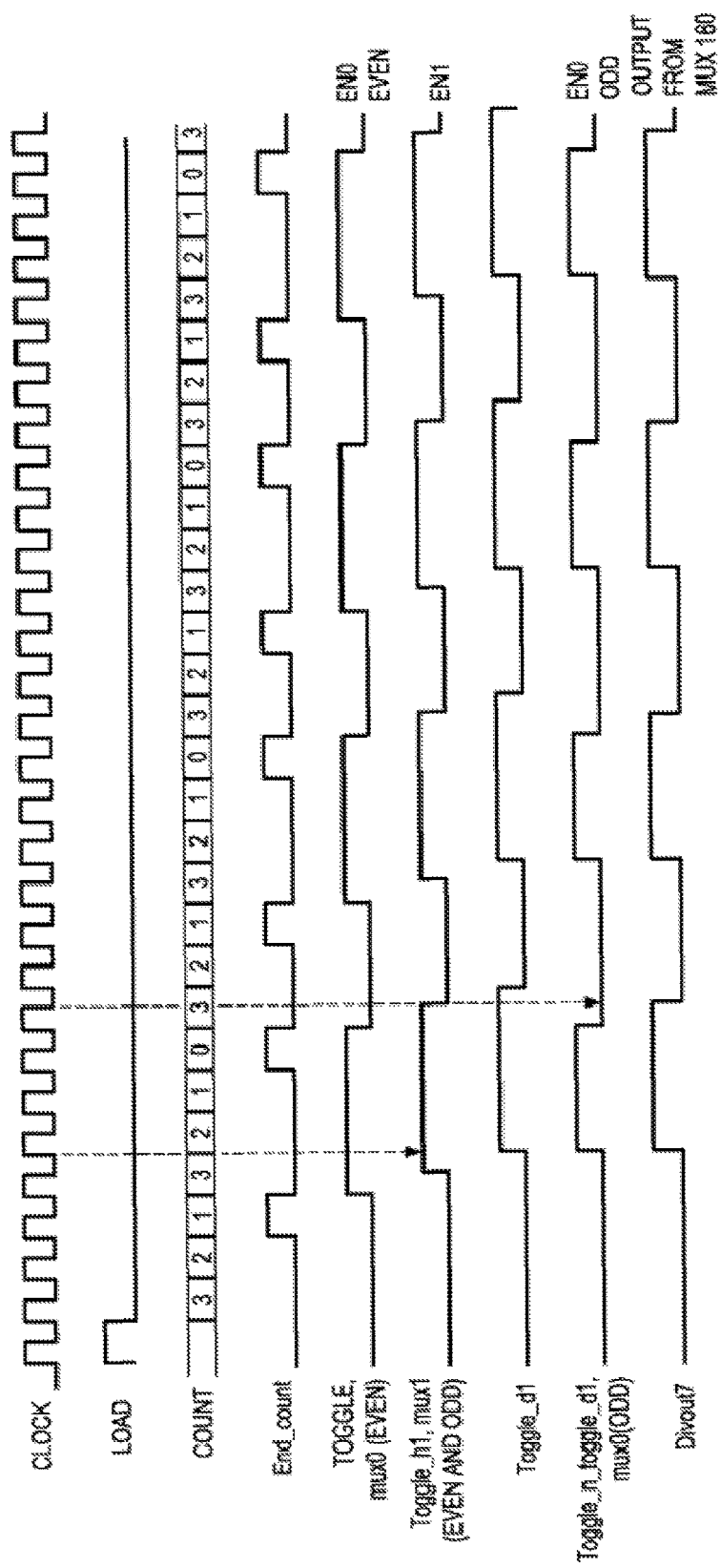
FIG. 5 is a timing diagram showing operation of a divider block of FIG. 3 while dividing by an odd number.
Figure 6:
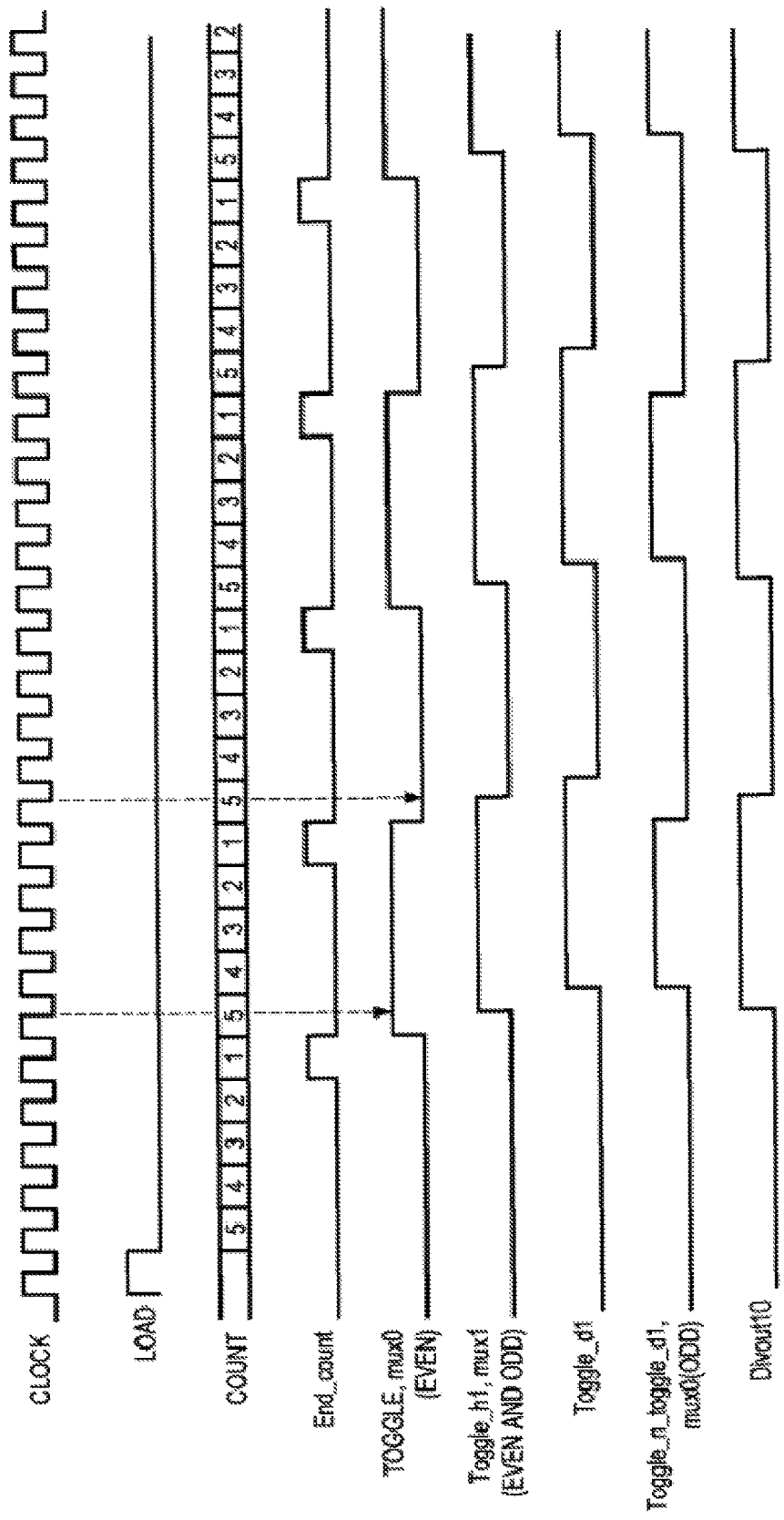
FIG. 6 is a timing diagram showing operation of a divider block of FIG. 3 while dividing by an even number.

The transitioning of the toggle signal as described above results in the generation of the toggle signal as running from falling edge of one pulse of the end count signal to the falling edge of the next pulse of the end count signal, as shown in FIG. 2A, and FIGS. 5-6. The use of this end count signal in the generation of the output of the clock signal as divided by the divider value will be described below, but first, the structure of the clock divider 150 will be discussed in connection with FIG. 3.

The clock divider 150 includes a flip flop 152 that is clocked by the clock signal, receives the toggle signal as input, and serves to output a version of the toggle signal toggle_d1 that is delayed by a full clock signal. A latch 154 is clocked by an inverse of the clock signal, also receives the toggle signal as input, and serves to output a version of the toggle signal toggle_h1 that is delayed by a half clock signal.

The AND gate 156 receives the toggle signal and the toggle_d1 signal as input and provides output to the multiplexer 158, which receives the toggle signal as its other input. The output of the multiplexer 158 is selected as a function of the LSB (odd) of the divider value. The signal output by the multiplexer 158 is labeled as EN0.

The multiplexer 160 receives as input the EN0 signal, as well as the toggle_h1 signal, which is also labeled as EN1. The output of the multiplexer 160 is selected as a function of the clock signal, and the signal output by the multiplexer 160 is the clock output signal, which is the clock signal divided by the divider value.

In operation, where the divider value is even, the toggle signal is connected through to the output of the multiplexer 158 as the EN0 signal. The EN0 signal is connected through to the output of the multiplexer 160 as the clkout signal when the clock signal is low. The EN1 signal is connected through to the output of the multiplexer 160 as the clkout signal when the clock signal is high. As a result, the pulse width of the clkout signal equals that of the toggle signal.

Where the divider value is odd, the result of a logical AND between the toggle signal and the toggle_d1 signal is connected through to the output of the multiplexer 158 as the EN0 signal. The EN0 signal is connected through to the output of the multiplexer 160 as the clkout signal when the clock signal is low. The EN1 signal is connected through to the output of the multiplexer 160 as the clkout signal when the clock signal is high. As a result, the pulse width of the clkout signal equals that of the clock signal, aligning the toggle signal to generate a 50/50 duty cycle clkout signal.

The design of divider block 56 described above allows for the division by both even and odd integers, and generates the clkout signal with a 50/50 duty cycle in a glitch free fashion. However, as should be appreciated, in some cases a divider block 54 capable of division by fractional numbers (such as an integer indivisible by two without a remainder) may be desired. Such a design will now be described.

Figure 7:
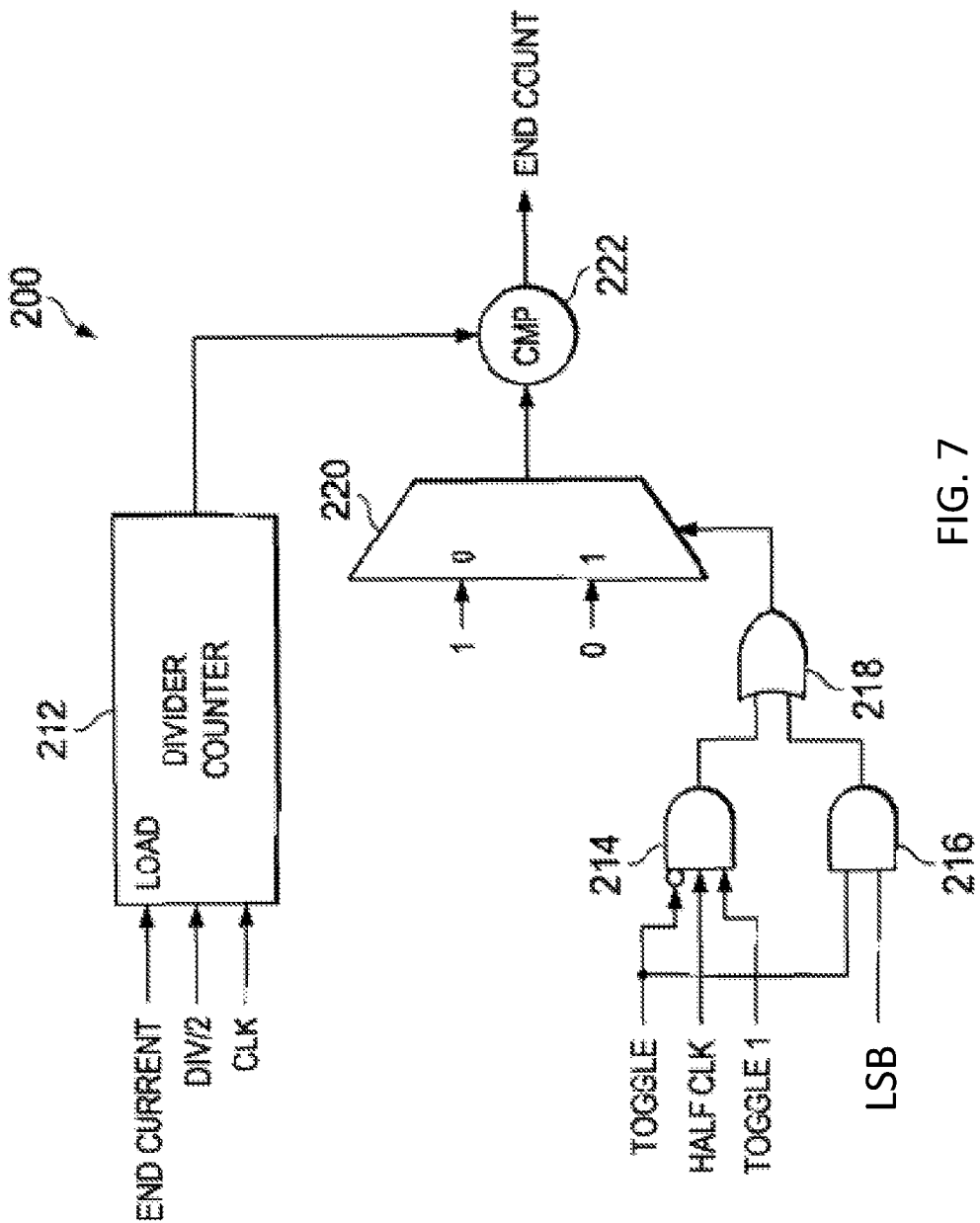
FIG. 7 is a schematic block diagram of the counter circuit of the divider blocks of FIG. 1 for the case where division by a fractional number is desired.

With reference to FIG. 7, a counter circuit 200 for use in a divider block 54 capable of division by a fractional number is now described.

The counter circuit 200 includes a clock divider counter 212, which is clocked by the clock signal, is reloaded based on the end count signal, and receives as input the divider value. The output of the clock divider counter 212 is coupled to the comparison block 222.

An AND gate 214 receives as input an inverted version of the toggle signal, a signal indicating that a half clock division is to be performed, and a toggle1 signal (while generation of the toggle1 signal will be described below. It should be understood that the toggle1 signal is asserted from a falling edge of one pulse of the toggle signal to a falling edge of a next pulse of the toggle signal). An AND gate 216 receives as input the LSB of the divider value and the toggle signal. An OR gate 218 receives as input the outputs from the AND gates 214 and 216, and provides output to a selection terminal of a multiplexer 220. The inputs of the multiplexer 220 are coupled to a reference value of one and a reference value of zero, and the output of the multiplexer 220 is coupled to the comparison block 222. The comparison block 222 generates the end count signal. The circuit formed by the multiplexer 220 and the comparison block 222 functions similarly to the circuit formed by the NOR gates 110 and 112, and the OR gate 114.

Operation of the counter circuit 200 will now be described with reference to FIGS. 9-10. Generally speaking, where a signal indicating that a half clock division is to be performed is not asserted, the counter circuit 200 provides the same output as the counter circuit 100 of FIG. 2 given the same inputs.

Figure 9:
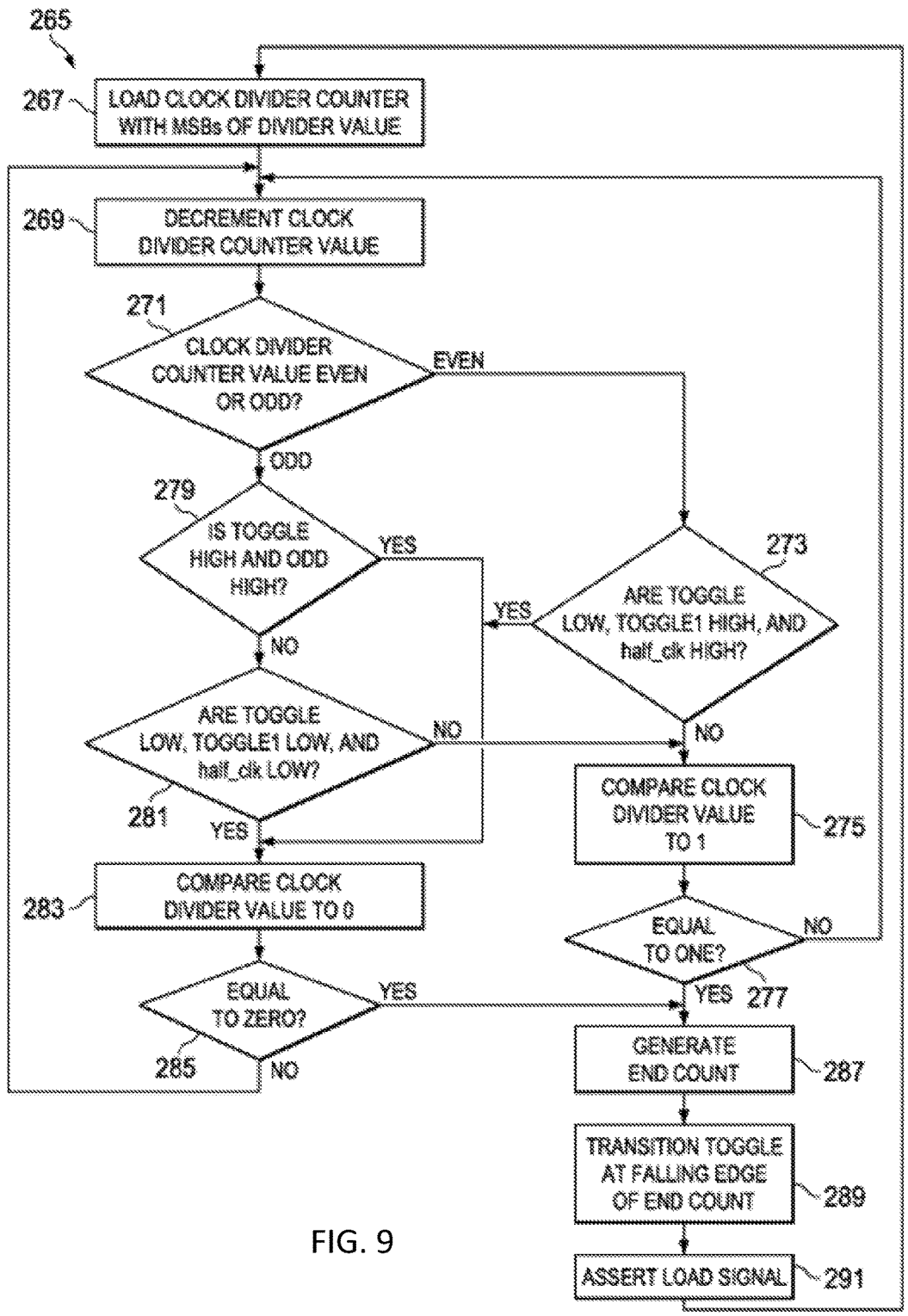
FIG. 9 is a flowchart of a method of operation of the counter circuit of FIG. 7.

As shown in the flowchart 265 of FIG. 9, initially, the clock divider counter 212 is loaded with the most significant bits (MSBs) of the divider value (Block 267). At the rising edge of each clock cycle, the clock divider counter 212 decrements the number stored therein by one (Block 269).

Where the clock divider counter value is even (Block 271)—as in where, when represented as a mixed number, the integer portion is even—where the toggle signal is low, where the toggle1 signal is high (thus the end count counter value is two), and where the half count signal is high (Block 273), AND gate 214 asserts its output, which in turn is passed by the OR gate 218 to the selection terminal of the multiplexer 220, causing it to select the zero at its second input. The comparison block 222 then compares the divider counter value to the zero from the multiplexer 220 (Block 283), which asserts the end count signal where the divider counter value is equal to zero (Block 285 and Block 287). Where the divider counter value was not zero, the clock divider counter value is decremented (Block 269), and the method continues from there.

In other scenarios (i.e. toggle is low, toggle1 is low, and the clock divider counter value is even, and thus end count counter is zero; toggle is high, toggle1 is low, and the clock divider is even, and thus end count counter is one; toggle is high, toggle1 is high, and the clock divider is even, and thus end count counter is three), (Block 273), then AND gate 214 deasserts its output. The output of AND gate 216 is deasserted where either toggle is low or the clock divider counter value is odd. In turn, OR gate 218 deasserts its output, causing multiplexer 220 to select the one at its first input. The comparison block 222 then compares the divider counter value to the one from the multiplexer 220 (Block 275), which asserts the end count signal where the divider counter value is equal to one (Block 277 and Block 287). Where the divider counter value was not one, the clock divider counter value is decremented (Block 269), and the method continues from there.

Where the clock divider counter value is odd (Block 271)—as in where, when represented as a mixed number, the integer portion is odd—and where the toggle signal is high AND gate 216 asserts its output, which in turn is passed by the OR gate 218 to the selection terminal of the multiplexer 220, which selects the zero at its second input. The comparison block 222 then compares the divider counter value with the zero from the multiplexer 220 (Block 283), and asserts the end count signal where the divider counter value is equal to zero (Block 285 and 287). Where the divider counter value was not zero, the clock divider counter value is decremented (Block 269), and the method continues from there.

If the toggle signal was not high, then AND gate 216 deasserts its output. In that case, output of the OR gate 218 is controlled by output of the AND gate 214, which serves to add an extra count during half clock division. To that end, the AND gate 214 is deasserted where toggle is high and the clock divider counter value is odd (Block 279), and where toggle is low, toggle1 is low (end count counter is zero), and the half clock signal is low (Block 281). The AND gate 214 is asserted where toggle is low and toggle1 is high (end count counter is two) and the half clock signal is high (Block 273).

Where neither AND gate 214 nor AND gate 216 asserts its output, OR gate 218 deasserts its output, causing multiplexer 220 to select the one at its first input. The comparison block 222 then compares the divider counter value to the one from the multiplexer 220 (Block 275), which asserts the end count signal where the divider counter value is equal to one (Block 277 and Block 287). Where the divider counter value was not one, the clock divider counter value is decremented (Block 269), and the method continues from there.

After generation of the end count signal (Block 287), the toggle signal is transitioned at the falling edge of the end count signal (Block 289), and the load signal is asserted at the same falling edge of the end count signal (Block 291). The assertion of the load signal causes the reloading of the clock divider counter with the MSBs of the divider value (Block 267), and the method restarts from there.

Figure 10:
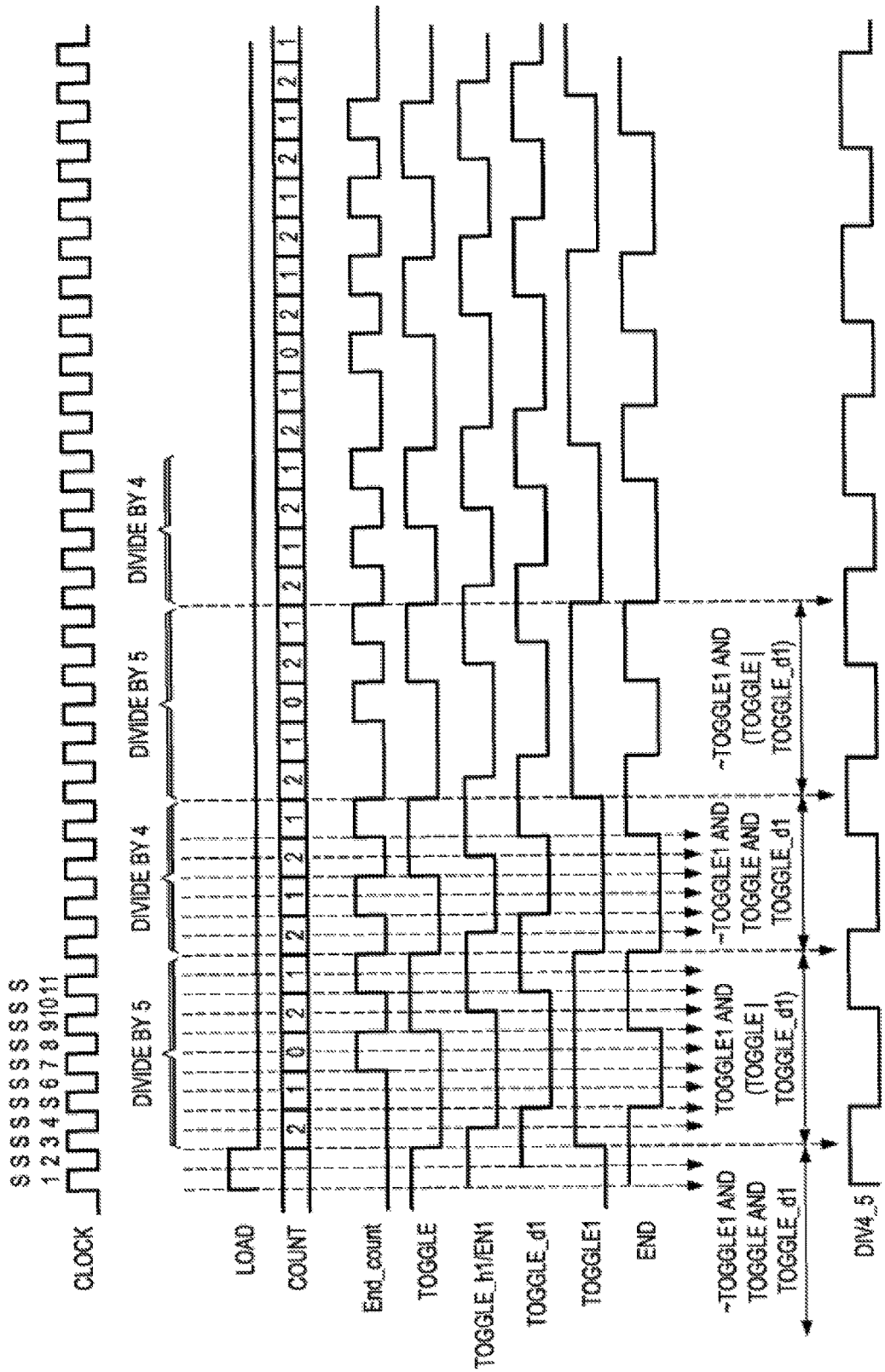
FIG. 10 is a timing diagram showing operation of a divider of FIG. 8 while dividing by a mixed number having an integer part that is even.

The transitioning of the toggle signal as described above results in the generation of the toggle signal as running from falling edge of one pulse of the end count signal to the falling edge of the next pulse of the end count signal, as shown in FIG. 10. The use of this end count signal in the generation of the output of the clock signal as divided by the divider value will be described below, but first, the structure of the clock divider 250 will be discussed.

Figure 8:
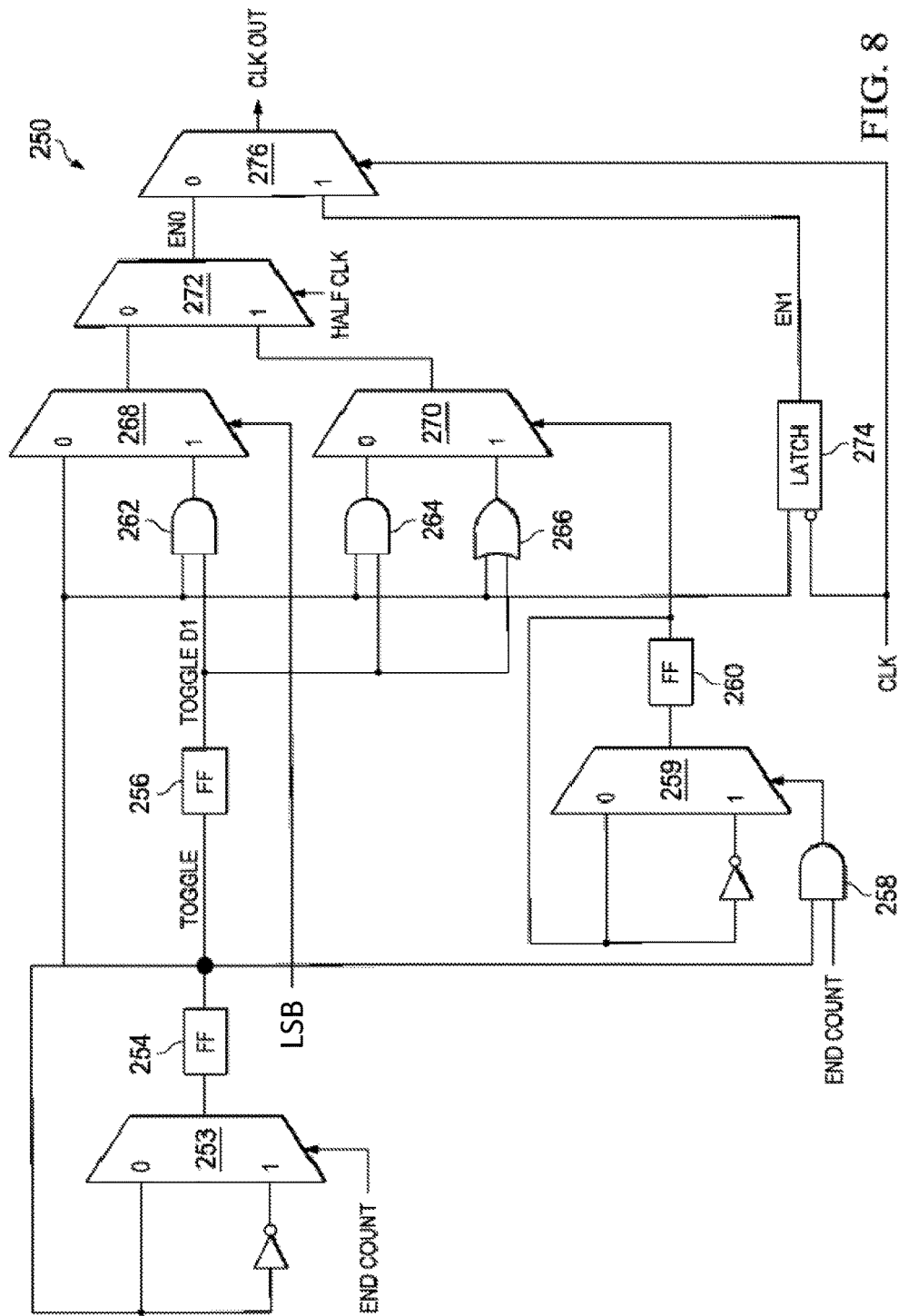
FIG. 8 is a schematic block diagram of the clock divider of the divider blocks of FIG. 1 for the case where division by a fractional number is desired.

With reference to FIG. 8, the clock divider 250 includes a multiplexer 253 receiving as input the toggle signal and an inverted version of the toggle signal, and being controlled by the end count signal. The multiplexer 253 provides its output to a flip flop 254. The flip flop 254 asserts the toggle signal at its output. A flip flop 256 receives as input the toggle signal, and asserts the clock signal delayed version of the toggle signal toggle_d1 at its output. The AND gate 262 receives as input the toggle signal and the toggle_d1 signal, and provides output as an input to the multiplexer 268, which receives the toggle signal as its other input, and the LSB of the divider value at its selection terminal.

The AND gate 258 receives the toggle signal and the end count as its input, provides its output to control multiplexer 259, which provides it output to flip flop 260 as input thereto, which in turn provides its output and an inverted version thereof to the multiplexer 259 as inputs. The output of the flip flop 260 is coupled to the selection terminal of the multiplexer 270. The AND gate 264 receives as input the toggle signal and the toggle_d1 signal, and provides its output to the multiplexer 270 as an input thereof. The OR gate 266 receives the toggle signal and the toggle_d1 signal as its input, and provides its output to the multiplexer 270 as another input thereof.

The multiplexer 272 receives the outputs of the multiplexers 268 and 270 as its inputs, and receives the half clock signal at its selection terminal. The multiplexer 272 asserts EN0 at its output.

The latch 274 receives the toggle signal at its input, is enabled by the inverted clock signal, and asserts the EN1 signal at its output. The multiplexer 276 receives the EN0 and EN1 signals as its input and the clock signal at its selection terminal, and asserts the clkout signal at its output.

Figure 3:
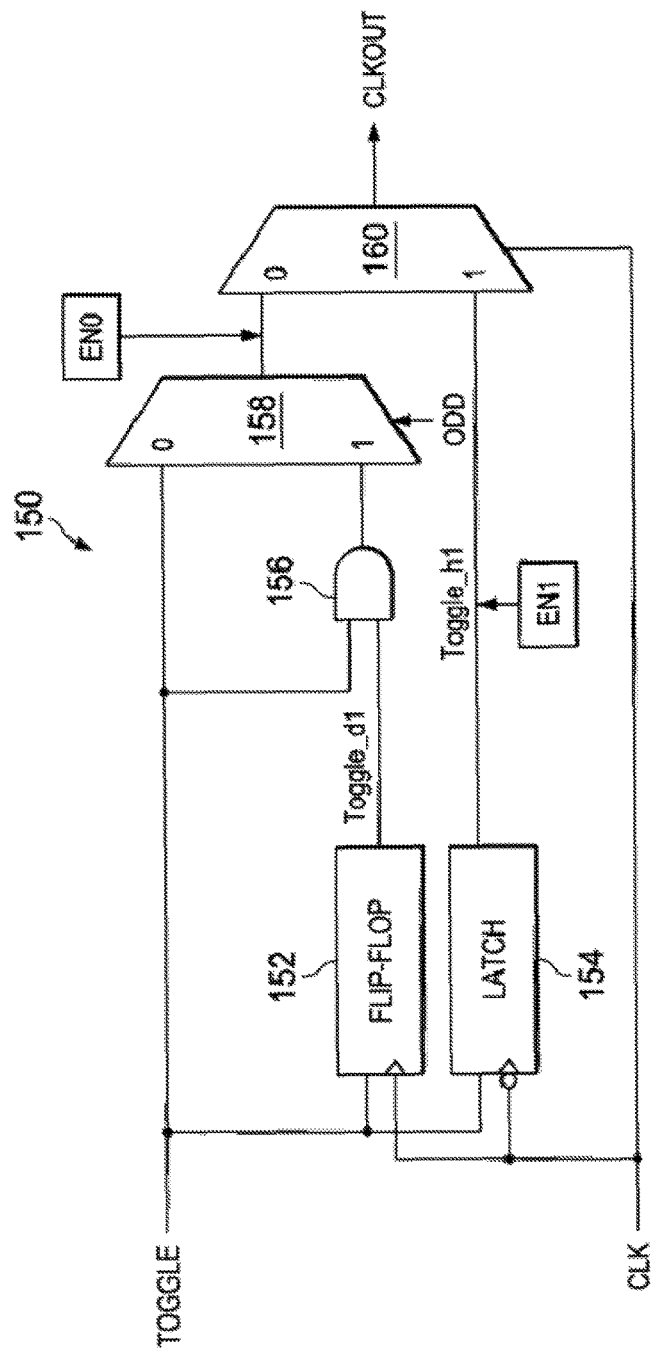
FIG. 3 is a schematic block diagram of the clock divider of the divider blocks of FIG. 1 for the case where division by an integer is desired.

Generally speaking, where the signal indicating that a half clock division is to be performed is not asserted, the clock divider 250 provides the same output as the clock divider 150 of FIG. 3 given the same inputs.

In operation, the clock divider serves to assert the EN0 signal when toggle1 is deasserted, toggle is asserted, and toggle_d1 is asserted, or when toggle1 is asserted and either of toggle or toggle_d1 is asserted. The EN0 signal is connected through to the output of the multiplexer 276 as the clkout signal when the clock signal is low.

Due to enabling of the latch 274 by an inverted version of the clock signal, the EN1 signal is asserted at the falling edge of the clock signal, and is connected through to the output of the multiplexer 276 as the clkout signal when the clock signal is high.

As can be seen from the timing diagram of FIG. 10, a true 50/50 duty cycle is not achieved by the divider block 56 when making a fractional division as described above, although the resulting clkout signal is close to a 50/50 duty cycle and is still suitable for use in a variety of applications.

As should be appreciated, the method described above is suitable for other fractional divides other than one half. For example, fraction divides of one quarter or one eighth may be made. In that case, the multiplexer 272 receives the outputs of the multiplexers 268 and 270 as its inputs, and receives a fractional divide signal at its selection terminal. The multiplexer 272 asserts the EN0 at its output. By changing the logic used in generating EN0, for example by adding delay to the inputs or selection terminal of the multiplexer 272, the duty cycle of clkout can be modified.

Figure 11:
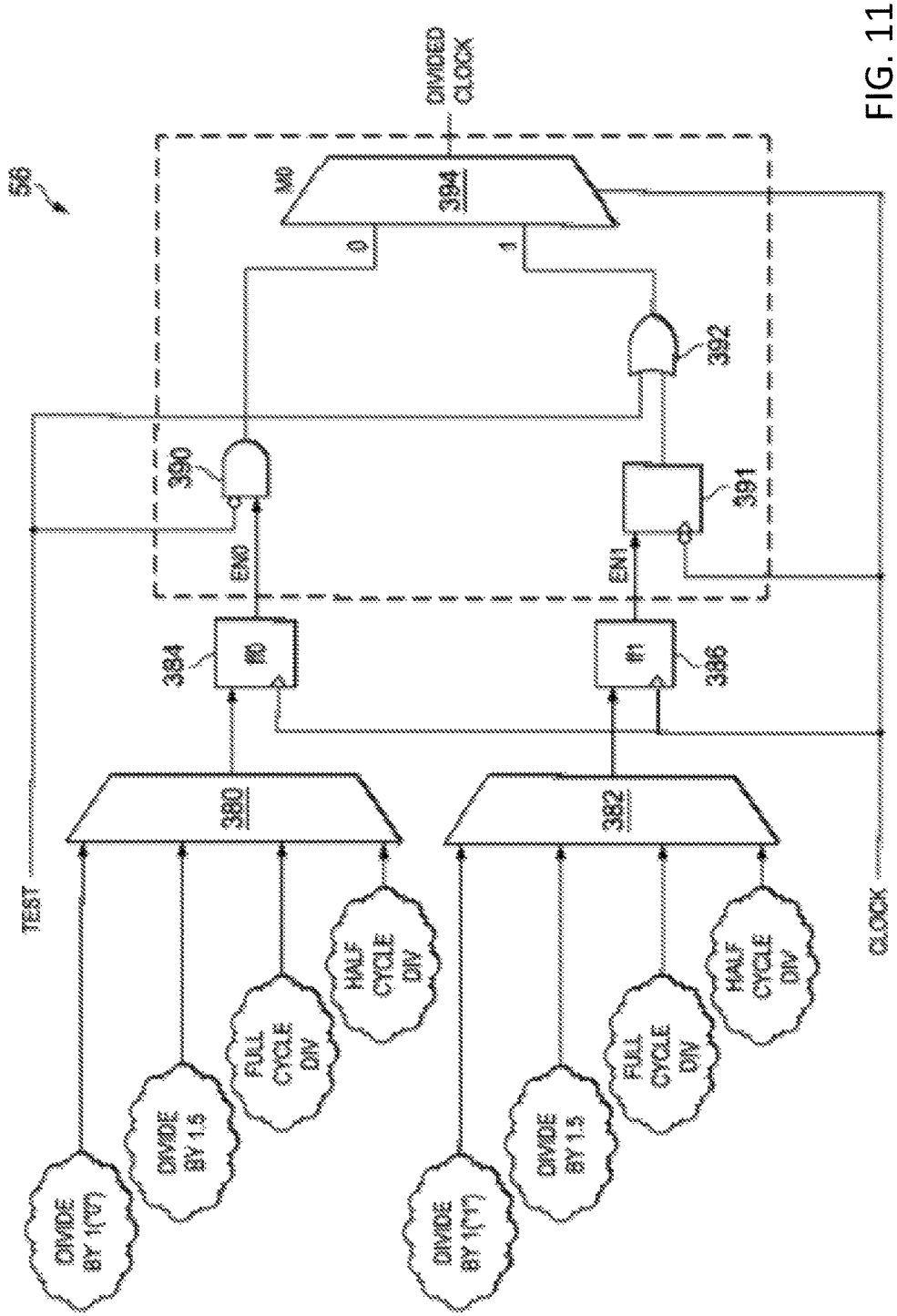
FIG. 11 is a block diagram of a further embodiment of the divider blocks of FIG. 1 for the case where division by a fractional number is desired.

With reference to FIG. 11, a further embodiment of a divider block 56 capable of making a fractional divide is now described. Here, the divider block includes two multiplexers 380 and 382, that each receive inputs from a state machine. The multiplexer 380 provides its output to the flip flop 384, while the multiplexer 382 provides its output to the flip flop 386. The flip flops 384 and 386 are clocked by the clock signal. The flip flop 384 provides its output to the AND gate 390 as the EN0 signal, while the flip flop 386 provides it output to the flip flop 391 as the EN1 signal. The flip flop 391 provides its output to the OR gate 392, which in turn provides its output to the multiplexer 394 as an input. The output of the AND gate 390 is also fed to the multiplexer 394 as an input. The multiplexer 394 has the clock signal coupled to its selection signal.

It should be understood that the AND gate 390 (which receives a test signal as input) and OR gate 392 are optional and there for testing purposes, and need not be present. Thus, the output of the flip flop 384 may be fed to the multiplexer 394 as input, and the output of the flip flop 391 may be fed to the multiplexer 394 as input.

Operation of this divider block 56 proceeds with generating the EN0 and EN1 signals as described above.

Figure 12:
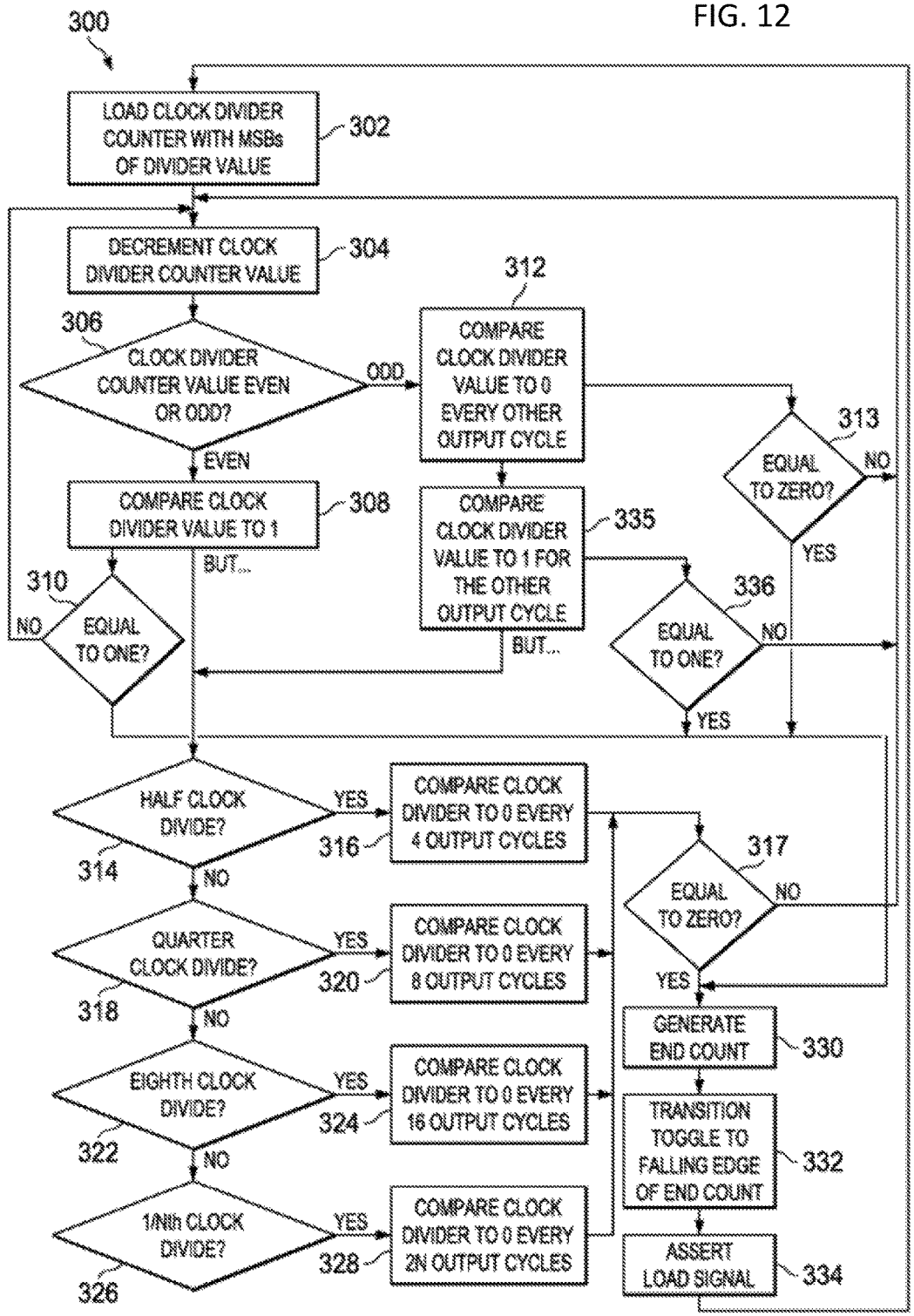
FIG. 12 is a flowchart of a method of generating a divided clock signal in accordance with this disclosure.

The methods and techniques descried in detail above for dividing by a fractional number will now be described more generally with reference to FIGS. 12-13. With reference to the flowchart 300 of FIG. 12, initially, the clock divider counter is loaded with the MSBs of the divider value (Block 302), and the clock divider counter is then decremented (Block 304).

Where the divider value is a mixed number having an even integer portion, the clock divider counter value (after each decrement of the clock divider counter value) is compared to one (Block 308). Where the clock divider counter value is equal to one (Block 310), the end count signal is then asserted (Block 330), toggle is transitioned at a falling edge of end count (Block 332), the load signal is asserted (Block 334), and then the clock divider counter is reloaded with the MSBs of the divider value (Block 302). Where the clock divider counter value is not equal to one (Block 310), the clock divider counter value is decremented (Block 304).

However, where the fractional portion of the divider value is one half (Block 314), every four assertions of the end count signal (referred to as output cycles in the flowchart 300), the clock divider counter value is compared to zero (Block 316), and where the clock divider counter value is equal to zero (Block 317), the method proceeds with asserting end count as described above.

Where the fractional portion of the divider value is one quarter (Block 318), every eight assertions of the end count signal, the clock divider counter value is also compared to zero (Block 320). Where the fractional portion of the divider value is one eighth (Block 322), every sixteen assertions of the end count signal, the clock divider counter value is also compared to zero (Block 324). Thus it follows that where the fractional portion of the divider value is N, every 2*N assertions of the end count signal (Block 326), the clock divider counter value is also compared to zero (Block 328).

Where the divider value is a mixed number having an odd integer portion, the clock divider counter value (after each decrement of the clock divider counter value) is compared to zero every other output cycle (Block 312), and where it is equal to zero (Block 313), the method proceeds to Block 330 and end count is asserted as described above. On the alternate output cycles, the clock divider counter value is compared to one (Block 335), and where it is equal to one (Block 336), the method proceeds to Block 330 and end count is asserted as described above.

The above is exampled and illustrated in the timing diagram shown in FIG. 13.

Although the preceding description has been described herein with reference to particular means, materials and embodiments, it is not intended to be limited to the particulars disclosed herein; rather, it extends to all functionally equivalent structures, methods, and uses, such as are within the scope of the appended claims.

The invention claimed is:

1. A method, comprising:
   loading a clock divider counter with most significant bits of a divider value;
   decrementing the clock divider counter at a same edge of each pulse of a clock signal;
   comparing a value contained in the clock divider counter to a reference value and generating an end count signal as a function of the value contained in the clock divider counter matching the reference value, using logic circuitry;
   if the divider value is an integer, then:
      if the value contained in the clock divider counter is even, setting the reference value to 1; and
      if the value contained in the clock divider counter is odd, setting the reference value to 1, except for every other assertion of the end count signal where the reference value is instead set to 0;
   transitioning a toggle signal at a same edge of each pulse of the end count signal;
   reloading the clock divider counter with most significant bits of the divider value as a function of the end count signal; and
   generating a divided version of the clock signal as a function of the toggle signal.

2. The method of claim 1, wherein the divider value is a mixed number having an integer part and a fractional part, with the fractional part being ½; and wherein the method also includes:
   if the integer part of the divider value is even, setting the reference value to 1, except for every 4th assertion of the end count signal where the reference value is instead set to 0; and
   if the integer part of the divider value is odd, setting the reference value to 1, except for:
      every other assertion of the end count signal, where the reference value is instead set to 0; and
      every 4th assertion of the end count signal, where the reference value is instead set to 0.

3. The method of claim 1, wherein the divider value is a mixed number having an integer part and a fractional part, with the fractional part being ¼; and wherein the method also includes:
   if the integer part of the divider value is even, setting the reference value to 1, except for:
      every 4th assertion of the end count signal, where the reference value is instead set to 0; and
      every 8th assertion of the end count signal, where the reference value is instead set to 0; and
   if the integer part of the divider value is odd, setting the reference value to 1, except for:
      every other assertion of the end count signal, where the reference value is instead set to 0;
      every 4th assertion of the end count signal, where the reference value is instead set to 0; and
      every 8th assertion of the end count signal, where the reference value is instead set to 0.

4. The method of claim 1, wherein the divider value is a mixed number having an integer part and a fractional part, with the fractional part being ⅛; and wherein the method also includes:
   if the integer part of the divider value is even, setting the reference value to 1, except for:
      every 4th assertion of the end count signal, where the reference value is instead set to 0;
      every 8th assertion of the end count signal, where the reference value is instead set to 0; and
      every 16th assertion of the end count signal, where the reference value is instead set to 0; and
   if the integer part of the divider value is odd, setting the reference value to 1, except for:
      every other assertion of the end count signal, where the reference value is instead set to 0;
      every 4th assertion of the end count signal, where the reference value is instead set to 0;
      every 8th assertion of the end count signal, where the reference value is instead set to 0; and
      every 16th assertion of the end count signal, where the reference value is instead set to 0.

5. The method of claim 1, wherein the divider value is a mixed number having an integer part and a fractional part, with the fractional part being ½; and wherein if the integer part of the divider value is even, the method also includes setting the reference value to 1, except for every 4th assertion of the end count signal where the reference value is instead set to 0.

6. The method of claim 1, wherein the divider value is a mixed number having an integer part and a fractional part, with the fractional part being ½; and wherein if the integer part of the divider value is odd, the method also includes setting the reference value to 1.

7. The method of claim 6, wherein if the integer part of the divider value is odd, the method also includes setting the reference value to 1 except for every other assertion of the end count signal where the reference value is instead set to 0.

8. The method of claim 7, wherein if the integer part of the divider value is odd, the method also includes setting the reference value to 1 except for every 4th assertion of the end count signal where the reference value is instead set to 0.

9. The method of claim 1, wherein the divider value is a mixed number having an integer part and a fractional part, with the fractional part being ¼; and wherein if the integer part of the divider value is even, the method also includes setting the reference value to 1.

10. The method of claim 9, wherein if the integer part of the divider value is even, the method also includes setting the reference value to 1, except for every 4th assertion of the end count signal, where the reference value is instead set to 0.

11. The method of claim 9, wherein if the integer part of the divider value is even, the method also includes setting the reference value to 1, except for every 8th assertion of the end count signal, where the reference value is instead set to 0.

12. The method of claim 1, wherein the divider value is a mixed number having an integer part and a fractional part, with the fractional part being ¼; and wherein if the integer part of the divider value is odd, the method also includes setting the reference value to 1.

13. The method of claim 12, wherein if the integer part of the divider value is odd, the method also includes setting the reference value to 1, except for every other assertion of the end count signal, where the reference value is instead set to 0.

14. The method of claim 12, wherein if the integer part of the divider value is odd, the method also includes setting the reference value to 1, except for every 4th assertion of the end count signal, where the reference value is instead set to 0.

15. The method of claim 12, wherein if the integer part of the divider value is odd, the method also includes setting the reference value to 1, except for every 8th assertion of the end count signal, where the reference value is instead set to 0.

16. The method of claim 1, wherein the divider value is a mixed number having an integer part and a fractional part, with the fractional part being ⅛; and wherein if the integer part of the divider value is even, the method also includes setting the reference value to 1.

17. The method of claim 16, wherein if the integer part of the divider value is even, the method also includes setting the reference value to 1, except for every 4th assertion of the end count signal, where the reference value is instead set to 0.

18. The method of claim 16, wherein if the integer part of the divider value is even, the method also includes setting the reference value to 1, except for every 8th assertion of the end count signal, where the reference value is instead set to 0.

19. The method of claim 16, wherein if the integer part of the divider value is even, the method also includes setting the reference value to 1, except for every 16th assertion of the end count signal, where the reference value is instead set to 0.

20. The method of claim 1, wherein the divider value is a mixed number having an integer part and a fractional part, with the fractional part being ⅛; and wherein if the integer part of the divider value is odd, the method also includes setting the reference value to 1.

21. The method of claim 20, wherein if the integer part of the divider value is odd, the method also includes setting the reference value to 1 except for every other assertion of the end count signal, where the reference value is instead set to 0.

22. The method of claim 20, wherein if the integer part of the divider value is odd, the method also includes setting the reference value to 1 except for every 4th assertion of the end count signal, where the reference value is instead set to 0.

23. The method of claim 20, wherein if the integer part of the divider value is odd, the method also includes setting the reference value to 1 except for every 8th assertion of the end count signal, where the reference value is instead set to 0.

24. The method of claim 20, wherein if the integer part of the divider value is odd, the method also includes setting the reference value to 1 except for every 16th assertion of the end count signal, where the reference value is instead set to 0.

25. A method, comprising:
loading a clock divider counter with most significant bits of a divider value;
decrementing the clock divider counter at a same edge of each pulse of a clock signal;
comparing a value contained in the clock divider counter to a reference value and generating an end count signal as a function of the value contained in the clock divider counter matching the reference value, using logic circuitry;
if the divider value is an integer, and if the value contained in the clock divider counter is even, setting the reference value to 1;
transitioning a toggle signal at a same edge of each pulse of the end count signal;
reloading the clock divider counter with most significant bits of the divider value as a function of the end count signal; and
generating a divided version of the clock signal as a function of the toggle signal.

26. The method of claim 25, wherein the divider value is a mixed number having an integer part and a fractional part, with the fractional part being ½; and wherein if the integer part of the divider value is even, the method also includes setting the reference value to 1, except for every 4th assertion of the end count signal, where the reference value is instead set to 0.

27. The method of claim 25, wherein the divider value is a mixed number having an integer part and a fractional part, with the fractional part being ¼; and wherein if the integer part of the divider value is even, the method also includes setting the reference value to 1.

28. The method of claim 27, wherein if the integer part of the divider value is even, the method also includes setting the reference value to 1, except for every 4th assertion of the end count signal, where the reference value is instead set to 0.

29. The method of claim 27, wherein if the integer part of the divider value is even, the method also includes setting the reference value to 1, except for every 8th assertion of the end count signal, where the reference value is instead set to 0.

30. The method of claim 25, wherein the divider value is a mixed number having an integer part and a fractional part, with the fractional part being ⅛; and wherein if the integer part of the divider value is even, the method also includes setting the reference value to 1.

31. The method of claim 30, wherein if the integer part of the divider value is even, the method also includes setting the reference value to 1, except for every 4th assertion of the end count signal, where the reference value is instead set to 0.

32. The method of claim 30, wherein if the integer part of the divider value is even, the method also includes setting the reference value to 1, except for every 8th assertion of the end count signal, where the reference value is instead set to 0.

33. The method of claim 30, wherein if the integer part of the divider value is even, the method also includes setting the reference value to 1, except for every 16th assertion of the end count signal, where the reference value is instead set to 0.

34. A method, comprising:
loading a clock divider counter with most significant bits of a divider value;
decrementing the clock divider counter at a same edge of each pulse of a clock signal;
comparing a value contained in the clock divider counter to a reference value and generating an end count signal as a function of the value contained in the clock divider counter matching the reference value, using logic circuitry;
if the divider value is an integer, and if the divider value is odd, setting the reference value to 1, except for every other assertion of the end count signal where the reference value is set to 0;
transitioning a toggle signal at a same edge of each pulse of the end count signal;
reloading the clock divider counter with most significant bits of the divider value as a function of the end count signal; and
generating a divided version of the clock signal as a function of the toggle signal.

35. The method of claim 34, wherein the divider value is a mixed number having an integer part and a fractional part, with the fractional part being ½; and wherein if the integer part of the divider value is odd, the method also includes setting the reference value to 1.

36. The method of claim 35, wherein if the integer part of the divider value is odd, the method also includes setting the reference value to 1 except for every other assertion of the end count signal, where the reference value is instead set to 0.

37. The method of claim 36, wherein if the integer part of the divider value is odd, the method also includes setting the reference value to 1 except for every 4th assertion of the end count signal, where the reference value is instead set to 0.

38. The method of claim 34, wherein the divider value is a mixed number having an integer part and a fractional part, with the fractional part being ¼; and wherein if the integer part of the divider value is odd, the method also includes setting the reference value to 1.

39. The method of claim 38, wherein if the integer part of the divider value is odd, the method also includes setting the reference value to 1, except for every other assertion of the end count signal, where the reference value is instead set to 0.

40. The method of claim 38, wherein if the integer part of the divider value is odd, the method also includes setting the reference value to 1, except for every 4th assertion of the end count signal, where the reference value is instead set to 0.

41. The method of claim 38, wherein if the integer part of the divider value is odd, the method also includes setting the reference value to 1, except for every 8th assertion of the end count signal, where the reference value is instead set to 0.

42. The method of claim 34, wherein the divider value is a mixed number having an integer part and a fractional part, with the fractional part being ⅛; and wherein if the integer part of the divider value is odd, the method also includes setting the reference value to 1.

43. The method of claim 42, wherein if the integer part of the divider value is odd, the method also includes setting the reference value to 1 except for every other assertion of the end count signal, where the reference value is instead set to 0.

44. The method of claim 42, wherein if the integer part of the divider value is odd, the method also includes setting the reference value to 1 except for every 4th assertion of the end count signal, where the reference value is instead set to 0.

45. The method of claim 42, wherein if the integer part of the divider value is odd, the method also includes setting the reference value to 1 except for every 8th assertion of the end count signal, where the reference value is instead set to 0.

46. The method of claim 42, wherein if the integer part of the divider value is odd, the method also includes setting the reference value to 1 except for every 16th assertion of the end count signal, where the reference value is instead set to 0.

* * * * *